(12) United States Patent
Annunziata et al.

(10) Patent No.: US 10,355,204 B2
(45) Date of Patent: Jul. 16, 2019

(54) SELECTIVE GROWTH OF SEED LAYER FOR MAGNETO-RESISTIVE RANDOM ACCESS MEMORY

(71) Applicant: International Business Machines Corporation, Armonk, NY (US)

(72) Inventors: Anthony J. Annunziata, Stamford, CT (US); Chandrasekharan Kothandaraman, New York, NY (US); Nathan P. Marchack, White Plains, NY (US); Eugene J. O'Sullivan, Nyack, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/452,357

(22) Filed: Mar. 7, 2017

(65) Prior Publication Data
US 2018/0261763 A1    Sep. 13, 2018

(51) Int. Cl.
*H01L 43/12*    (2006.01)
*H01L 43/08*    (2006.01)
*H01L 27/22*    (2006.01)

(52) U.S. Cl.
CPC .............. *H01L 43/12* (2013.01); *H01L 43/08* (2013.01); *H01L 27/228* (2013.01)

(58) Field of Classification Search
CPC ... H01L 43/08; H01L 43/12; H01L 21/28562; G11C 2211/5615; G11C 11/161; C23C 18/16–54
See application file for complete search history.

(56) References Cited

U.S. PATENT DOCUMENTS

| | | | |
|---|---|---|---|
| 8,278,216 B1 | 10/2012 | Alers et al. | |
| 9,042,057 B1 | 5/2015 | Diao et al. | |
| 9,105,695 B2 | 8/2015 | Shek et al. | |
| 9,153,482 B2 | 10/2015 | Knisley et al. | |
| 9,299,745 B2 | 3/2016 | Zhang et al. | |
| 2005/0181226 A1* | 8/2005 | Weidman ............ | C23C 18/1619 428/544 |
| 2006/0094130 A1 | 5/2006 | Horikoshi | |
| 2015/0221542 A1* | 8/2015 | Knisley ............ | H01L 21/76883 438/653 |
| 2015/0325446 A1 | 11/2015 | Yu et al. | |
| 2016/0248002 A1 | 8/2016 | Lu et al. | |

FOREIGN PATENT DOCUMENTS

WO    2016040077 A1    3/2016

OTHER PUBLICATIONS

Anonymous, "Endura Volta™ CVD Cobalt", Retrieved online URL:<http://www.appliedmaterials.com/products/endura-volta-cvd-cobalt>, 7 pages.

* cited by examiner

*Primary Examiner* — Robert T Huber
*Assistant Examiner* — Gardner W. S. Swan
(74) *Attorney, Agent, or Firm* — Cantor Colburn LLP; Vazken Alexanian

(57) ABSTRACT

A method of fabricating a magneto-resistive random access memory (MRAM) cell with at least one magnetic tunnel junction (MTJ) is provided. The method includes disposing a metallic landing pad within a dielectric pad in a substrate and selectively depositing seed layer material over the substrate. This selective deposition forms a seed layer on which the MTJ is disposable on the metallic landing pad but not the dielectric pad.

11 Claims, 3 Drawing Sheets

US 10,355,204 B2

SELECTIVE GROWTH OF SEED LAYER FOR MAGNETO-RESISTIVE RANDOM ACCESS MEMORY

BACKGROUND

The present invention relates in general to magneto-resistive random access memory (MRAM). More particularly, the present invention relates to selective growth of a seed layer for an MRAM cell to be provided with at least one magnetic tunnel junction (MTJ).

Data in MRAM is stored by magnetic storage elements. The elements are formed from ferromagnetic plates that each hold a magnetization and which are separated by a thin insulating layer. One of the two plates is provided as a permanent magnet that is set to a particular polarity (i.e., the fixed or reference layer) and the magnetization of the other plate can be changed to match that of an external field in order to store data (i.e., the free layer). This configuration is known as a magnetic tunnel junction (MTJ). A memory device can be built from a grid of MTJ "cells" where each cell includes multiple MTJs.

SUMMARY

According to some embodiments of the present invention, a method of fabricating a magneto-resistive random access memory (MRAM) cell with at least one magnetic tunnel junction (MTJ) is provided. The method includes disposing a metallic landing pad within a dielectric pad in a substrate and selectively depositing seed layer material over the substrate. This selective deposition forms a seed layer on which the MTJ is disposable on the metallic landing pad but not the dielectric pad.

According to some embodiments of the present invention, an intermediate structure of a mid-fabrication magneto-resistive random access memory (MRAM) cell is provided. The intermediate structure is configured to be provided with at least one magnetic tunnel junction (MTJ). The intermediate structure includes a metallic landing pad disposed within a dielectric pad in a substrate and a seed layer. The seed layer is formed from selective deposition of seed layer material over the substrate on the metallic landing pad but not the dielectric pad. The MTJ is disposable on the seed layer.

According to some embodiments of the present invention, a magneto-resistive random access memory (MRAM) cell is provided. The MRAM cell includes a metallic landing pad disposed within a dielectric pad in a substrate, a seed layer and a magnetic tunnel junction (MTJ). The seed layer is formed from selective deposition of seed layer material over the substrate and is disposed on the metallic landing pad but not the dielectric pad. The MTJ is deposited and patterned on the seed layer.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1:
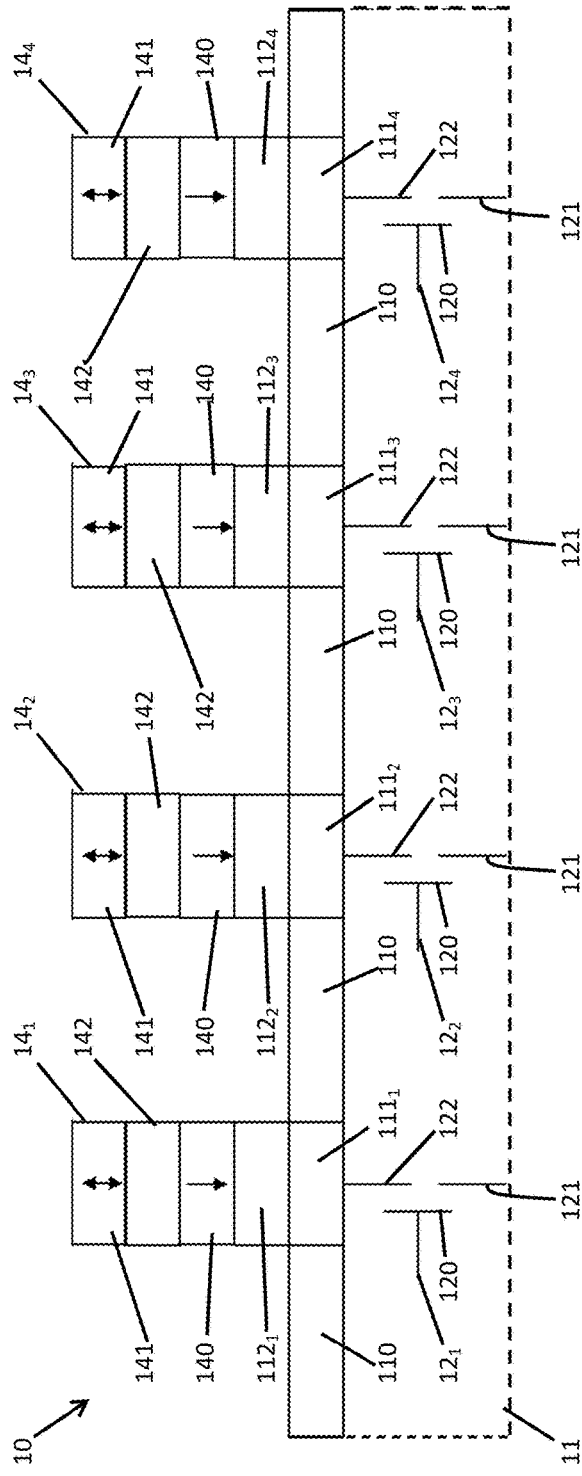
FIG. 1 is an elevational view of a magneto-resistive random access memory (MRAM) cell in accordance with embodiments.

Reading from an MRAM memory device can be accomplished by measurement of electrical resistance of a cell. A particular cell is typically selected by powering an associated transistor that switches current from a supply line through the cell to ground. Due to the tunnel magneto-resistance, the electrical resistance of the cell changes due to the relative orientation of the magnetization in the fixed and free layers. By measuring the resulting current, the resistance inside any particular cell can be determined and from this the magnetization polarity of the free layer can be determined as well. If the fixed and free layers have the same magnetization alignment (low resistance state) this is usually considered to mean a "1" while if the alignment is antiparallel the resistance will be higher (high resistance state) and this usually means a "0." Data is written to the cells using a variety of methods such as spin transfer torque (STT) or spin transfer switching which uses spin-aligned ("polarized") electrons to directly apply torque to the domains. Here, while the magnetization of the fixed layer is fixed in a given direction, current passed in a first direction through the MTJ makes the magnetization of the free layer parallel with respect to that of the fixed layer whereas a current passed through the MTJ in a second direction makes the magnetization of the free layer anti-parallel with respect to that of the fixed layer.

STT-MRAM devices in particular offer many benefits over semiconductor-based memory technologies, such as dynamic random-access memory (DRAM) and static random-access memory (SRAM), but in order to compete with DRAM and SRAM, the STT-MRAM devices must be integrated into the wiring layers of standard silicon logic and memory chips.

As will be described below, an optimized seed layer is provided for a magneto-resistive random access memory (MRAM) cell such that a magnetic tunnel junction (MTJ) stack can be deposited or "grown" thereon. The seed layer is formed from selective deposition of metallic material (e.g., cobalt) using chemical vapor deposition or another chemically-active process that can deposit the metallic material on a copper substrate but not on silicon oxide, silicon nitride or low-k dielectric surfaces. Thus, the seed layer simultaneously caps an exposed line and eliminates diffusion of certain metallic materials (e.g., copper) into the MTJ stack.

The seed layer will have a strong and positive effect on MRAM cell performance and uniformity in comparison with typical complementary metal-oxide-semiconductor (CMOS) back end of line (BEOL) materials, such as copper, which do not tend to perform well in seed layers for MTJ stacks in MRAM cells. Furthermore, the seed layer will be selectively grown or deposited on a metallic landing pad and will be smoother and less subject to stress/strain states as compared to what would otherwise be possible with CMOS BEOL materials.

The methods and processes described herein can be particularly applicable in the formation of advanced semiconductor nodes. As used herein, such advanced semiconductor nodes are MRAM cells or devices with sub-35 or, more particularly, 15-25 nm or less diameters and spacing or pitch of about 100-200 nm or less.

With reference to FIG. 1, a magneto-resistance random access memory (MRAM) cell 10 is provided. The MRAM cell 10 includes a substrate 11, first-fourth transistors $12_{1-4}$ and first-fourth MTJs $14_{1-4}$. Each of the first-fourth transistors $12_{1-4}$ is supportively disposed within the substrate 11. The substrate 11 can be provided with a combination of conductive, semi-conductive and non-conductive or dielectric substrate materials. Each of the first-fourth MTJs $14_{1-4}$ is stacked on or over or otherwise electrically connected with a corresponding one of the first-fourth transistors $12_{1-4}$.

Figure 3:
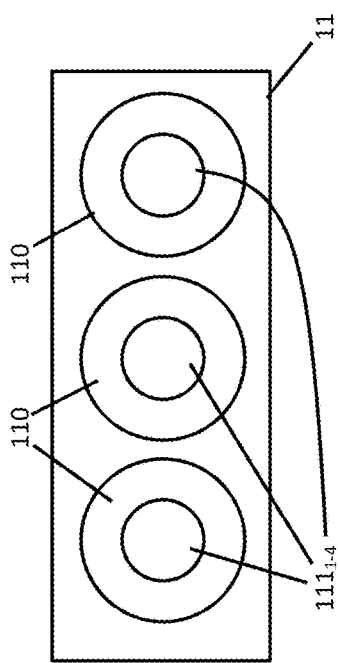
FIG. 3 is a top-down view of an MRAM cell in accordance with alternative embodiments.
Figure 2:
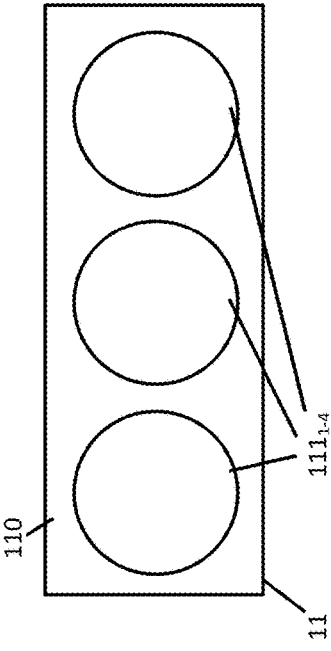
FIG. 2 is a top-down view of the MRAM cell of FIG. 1 in accordance with embodiments.

With reference to FIGS. 2 and 3 and, in accordance with embodiments, the substrate 11 can be formed of first-fourth metallic landing pads $111_{1-4}$ that are respectively disposed within dielectric material pads 110. As shown in FIG. 2, the upper surface of the substrate 11 can be formed of the material of the dielectric materials pads 110 whereby the first-fourth metallic landing pads $111_{1-4}$ are arranged as islands in the dielectric material. Alternatively, as shown in FIG. 3, the upper surface of the substrate 11 can be generally formed of another substrate material whereby the dielectric material pads 110 are arranged as islands in the substrate material and the first-fourth metallic landing pads $111_{1-4}$ are arranged as islands in the dielectric material pads 110.

While the first-fourth metallic landing pads $111_{1-4}$ are illustrated in FIG. 2 and the dielectric material pads 110 and the first-fourth metallic landing pads $111_{1-4}$ are illustrated in FIG. 3 as being annular or circular in shape, it is to be understood that this is not required and that other shapes or configurations are possible. For example, the dielectric material pads 110 and the first-fourth metallic landing pads $111_{1-4}$ of FIG. 3 can be rectangular or the dielectric material pads 110 of FIG. 3 can be annular and the first-fourth metallic landing pads $111_{1-4}$ of FIG. 3 can be rectangular.

With reference back to FIG. 1, the first-fourth metallic landing pads $111_{1-4}$ are proximate to or coupled with or otherwise electrically connected with corresponding ones of the first-fourth transistors $12_{1-4}$ and can include copper (Cu), aluminum (Al), tantalum (Ta), tantalum nitride (TaN), titanium (Ti), titanium nitride (TiN), other similar materials and/or combinations thereof. As will be described herein, formation of the first-fourth MTJs $14_{1-4}$ is accomplished by deposition (e.g., PECVD, plating or electro-less plating) of first-fourth seed layers $112_{1-4}$ on corresponding ones of the first-fourth metallic landing pads $111_{1-4}$ and subsequent deposition or growth of the first-fourth MTJs $14_{1-4}$ on corresponding ones of the first-fourth seed layers $112_{1-4}$.

The first transistor $12_1$ includes a base terminal 120, a collector terminal 121 and an emitter terminal 122. The first MTJ $14_1$ includes a fixed layer 140, a free layer 141 and an insulator 142. The fixed layer 140 can be provided as a layer of magnetic material and has a fixed magnetic polarity and can be coupled directly or indirectly (i.e., via the first seed layer $112_1$ and the first metallic landing pad $1110$ to or otherwise electrically connected with the emitter terminal 122 of the first transistor $12_1$. The free layer 141 can be provided as a layer of magnetic material and has a variable magnetic polarity. The insulator 142 can be provided as a layer of dielectric material, such as magnesium oxide, and is interposed between the fixed layer 140 and the free layer 141.

During operations of the MRAM cell 10, the variable magnetic polarity of the free layer 141 of the first MTJ $14_1$ can be set in a parallel or anti-parallel condition with respect to the fixed magnetic polarity of the fixed layer 140. In the parallel condition, the first MTJ $14_1$ exhibits reduced resistance to current being passed through it as compared to the anti-parallel condition. Thus, when the variable magnetic polarity of the free layer 141 is set in the parallel condition with respect to the fixed magnetic polarity of the fixed layer 140, the first MTJ $14_1$ can be read as a "1." By contrast, when the variable magnetic polarity of the free layer 141 is set in the anti-parallel condition with respect to the fixed magnetic polarity of the fixed layer 140, the first MTJ $14_1$ can be read as a "0."

The second transistor $12_2$ includes a base terminal 120, a collector terminal 121 and an emitter terminal 122. The second MTJ $14_2$ includes a fixed layer 140, a free layer 141 and an insulator 142. The fixed layer 140 can be provided as a layer of magnetic material and has a fixed magnetic polarity and can be coupled directly or indirectly (i.e., via the second seed layer $112_2$ and the second metallic landing pad $111_2$) to or otherwise electrically connected with the emitter terminal 122 of the second transistor $12_2$. The free layer 141 can be provided as a layer of magnetic material and has a variable magnetic polarity. The insulator 142 can be provided as a layer of dielectric material, such as magnesium oxide, and is interposed between the fixed layer 140 and the free layer 141.

During operations of the MRAM cell 10, the variable magnetic polarity of the free layer 141 of the second MTJ $14_2$ can be set in a parallel or anti-parallel condition with respect to the fixed magnetic polarity of the fixed layer 140. In the parallel condition, the second MTJ $14_2$ exhibits reduced resistance to current being passed through it as compared to the anti-parallel condition. Thus, when the variable magnetic polarity of the free layer 141 is set in the parallel condition with respect to the fixed magnetic polarity of the fixed layer 140, the second MTJ $14_2$ can be read as a "1." By contrast, when the variable magnetic polarity of the free layer 141 is set in the anti-parallel condition with respect to the fixed magnetic polarity of the fixed layer 140, the second MTJ $14_2$ can be read as a "0."

The third transistor $12_3$ includes a base terminal 120, a collector terminal 121 and an emitter terminal 122. The third MTJ $14_3$ includes a fixed layer 140, a free layer 141 and an insulator 142. The fixed layer 140 can be provided as a layer of magnetic material and has a fixed magnetic polarity and can be coupled directly or indirectly (i.e., via the third seed layer $112_3$ and the third metallic landing pad $111_3$) to or otherwise electrically connected with the emitter terminal 122 of the third transistor $12_3$. The free layer 141 can be provided as a layer of magnetic material and has a variable magnetic polarity. The insulator 142 can be provided as a layer of dielectric material, such as magnesium oxide, and is interposed between the fixed layer 140 and the free layer 141.

During operations of the MRAM cell 10, the variable magnetic polarity of the free layer 141 of the third MTJ $14_3$ can be set in a parallel or anti-parallel condition with respect to the fixed magnetic polarity of the fixed layer 140. In the parallel condition, the third MTJ $14_3$ exhibits reduced resistance to current being passed through it as compared to the anti-parallel condition. Thus, when the variable magnetic polarity of the free layer 141 is set in the parallel condition with respect to the fixed magnetic polarity of the fixed layer 140, the third MTJ $14_3$ can be read as a "1." By contrast, when the variable magnetic polarity of the free layer 141 is set in the anti-parallel condition with respect to the fixed magnetic polarity of the fixed layer 140, the third MTJ $14_3$ can be read as a "0."

The fourth transistor $12_4$ includes a base terminal 120, a collector terminal 121 and an emitter terminal 122. The fourth MTJ $14_4$ includes a fixed layer 140, a free layer 141 and an insulator 142. The fixed layer 140 can be provided as a layer of magnetic material and has a fixed magnetic polarity and can be coupled directly or indirectly (i.e., via the fourth seed layer $112_4$ and the fourth metallic landing pad $111_4$) to or otherwise electrically connected with the emitter terminal 122 of the fourth transistor $12_4$. The free layer 141 can be provided as a layer of magnetic material and has a variable magnetic polarity. The insulator 142 can be provided as a layer of dielectric material, such as magnesium oxide, and is interposed between the fixed layer 140 and the free layer 141.

During operations of the MRAM cell 10, the variable magnetic polarity of the free layer 141 of the fourth MTJ $14_4$ can be set in a parallel or anti-parallel condition with respect to the fixed magnetic polarity of the fixed layer 140. In the parallel condition, the fourth MTJ $14_4$ exhibits reduced resistance to current being passed through it as compared to the anti-parallel condition. Thus, when the variable magnetic polarity of the free layer 141 is set in the parallel condition with respect to the fixed magnetic polarity of the fixed layer 140, the fourth MTJ $14_4$ can be read as a "1." By contrast, when the variable magnetic polarity of the free layer 141 is set in the anti-parallel condition with respect to the fixed magnetic polarity of the fixed layer 140, the fourth MTJ $14_4$ can be read as a "0."

While FIG. 1 and the accompanying text refer to there being four transistors and four MTJs in the MRAM cell 10, it is to be understood that this is not required and that there can be greater or lesser numbers of each. For purposes of clarity and brevity, however, the description will generally relate only to the "four/four" embodiments. In any case, it is to be understood that each one of the first-fourth MTJs $14_{1-4}$ represents a "1" or "0" bit in the MRAM cell 10 and can be written and then read as such.

A method of fabricating an MRAM cell with at least one MTJ, such as the MRAM cell 10 of FIG. 1, will now be described with reference to FIGS. 4-7.

Figure 4:
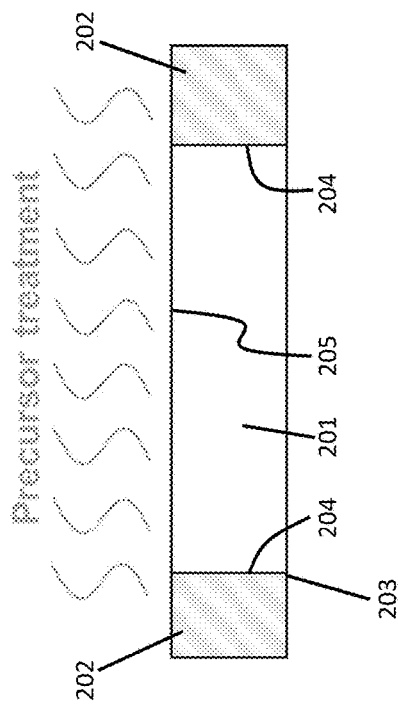
FIG. 4 is a side schematic view of a first fabrication stage of a magnetic tunnel junction (MTJ) stack of at least a portion of an MRAM cell.

As shown in FIG. 4, at a first or initial stage of the fabrication, multiple metallic landing pads 201 are respectively disposed within corresponding ones of multiple dielectric pads 202 within a substrate 203. Each metallic landing pad 201 can include at least one or more of copper (Cu), aluminum (Al), tantalum (Ta), tantalum nitride (TaN), titanium (Ti) and titanium nitride (TiN) and each dielectric pad 202 can include at least one or more of silicon oxide ($SiO_2$), silicon nitride ($Si_3N_4$) and other low-k dielectric materials. Each metallic landing pad 201 and each dielectric pad 202 can have a thickness that is equal to or less than a thickness of the substrate 203 and the borders or interfaces between sidewalls 204 of each metallic landing pad 201 and its corresponding dielectric pad 202 can be substantially perpendicular to at least the upper surface 205 of the substrate 203 (i.e., the respective upper surfaces of the metallic landing pads 201 and the dielectric pads 202).

In accordance with embodiments, the respective disposing of the multiple metallic landing pads 201 within the corresponding ones of the multiple dielectric pads 202 can be accomplished by damascene metal line formation or other similar processes.

Figure 5:
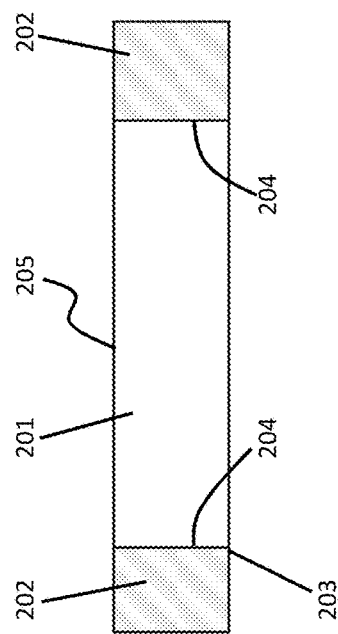
FIG. 5 is a side schematic view of a second fabrication stage of a magnetic tunnel junction (MTJ) stack of an MRAM cell.
Figure 6:
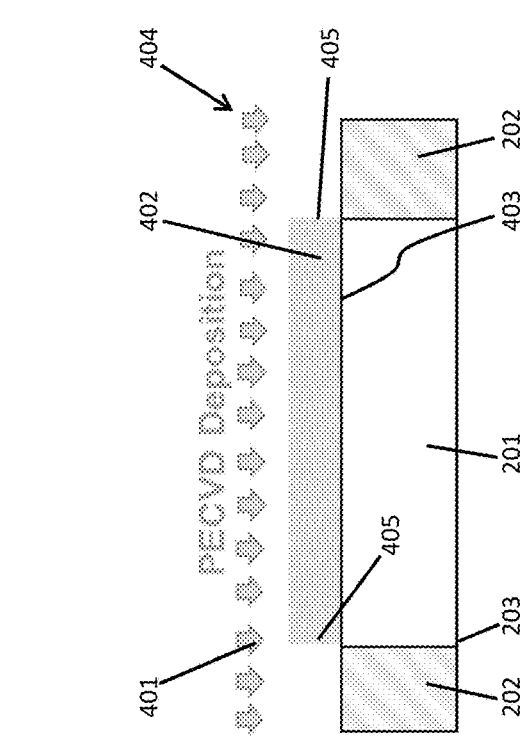
FIG. 6 is a side schematic view of a third fabrication stage of a magnetic tunnel junction (MTJ) stack of at least a portion of an MRAM cell.

As shown in FIG. 5, an optional step or operation following the disposing of the multiple metallic landing pads 201 within the corresponding ones of the multiple dielectric pads 202 involves conducting a pre-cursor treatment with respect to the upper surface 205 of the substrate 203. This pre-cursor treatment prepares the upper surface 205 for subsequent depositional processes and can be executed with hydrogen H2 gas, for example, in combination with ultraviolet (UV) light or other similar processes As shown in FIG. 6, a next step or operation in the fabrication involves the selective deposition of seed layer material 401 over the substrate 203. This selective deposition can be executed as at least one of plasma-enhanced chemical vapor deposition (PECVD), electro-less plating of metallic material and other similar processes. In any case, the selective deposition forms a seed layer 402 on which the MTJ is disposable on only an upper surface 403 of the multiple metallic landing pads 201 and not on the multiple dielectric pads 202 and results in the formation of an intermediate structure 404.

For each instance of seed layer 402, the seed layer 402 has a sidewall 405 that extends upwardly from the corresponding border or interface between sidewall 204 and the corresponding or adjacent dielectric pad 202. This sidewall 405 can be disposed at a normal angle with respect to a plane of the upper surface 403, such that the sidewall 405 is coplanar with the corresponding border or interface between sidewall 204 and the corresponding or adjacent dielectric pad 202 and such that the seed layer 402 has a same shape and size as the underlying metallic landing pad 201, or can be angled with respect to the plane of the upper surface 403 (see FIGS. 8 and 9 to be discussed below).

In accordance with embodiments, the seed layer material 401 and the resulting seed layer 402 includes cobalt (Co) or other similar metallic materials which are well suited for MRAM cell usage. The seed layer material 401 (and the resulting seed layer 402) does not, however, include copper (Cu) or other metallic materials that are ill suited for MRAM cell usage.

Figure 7:
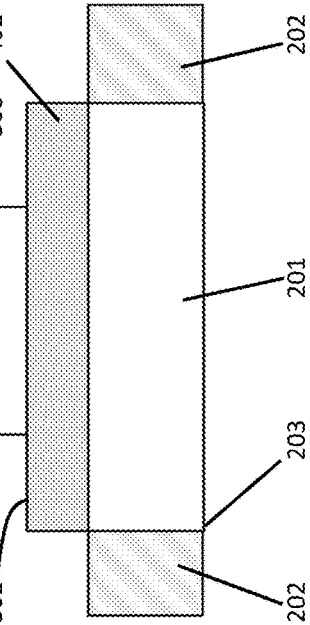
FIG. 7 is a side schematic view of a fourth fabrication stage of a magnetic tunnel junction (MTJ) stack of at least a portion of an MRAM cell.

As shown in FIG. 7, in a last step or operation in the fabrication, an MTJ 501 is deposited and pattered on an upper surface 502 of the seed layer 402 to form at least a portion of an MRAM cell 510. The MTJ 501 includes a fixed or reference layer 503, which is disposed on the upper surface 502, a free layer 504 that is remote from the seed layer 402 and an insulator 505, which is interposed between the fixed or reference layer 503 and the free layer 504.

With the method of FIGS. 4-7 completed, the seed layer 402 of the MRAM cell 510 of FIG. 5 is substantially absent copper (Cu) or other similar metallic materials that are ill suited for MRAM cell usage. In addition, because each instance of the seed layer 402 is interposed between each metallic landing pad 201 and each corresponding MTJ 501, the seed layer 402 effectively caps each underlying metallic landing pad 201 and thereby blocks copper diffusion from the metallic landing pad 201 and into the MTJ 501.

It is to be further understood that while conventional MRAM cell fabrication techniques involve lithographic, etching and polishing (e.g., CMP) operations, the method of FIGS. 4-7 can be completed absent such lithographic, etching and polishing operations. Nevertheless, the method of FIGS. 4-7, still obtains a resultant seed layer 402 in a substantially smooth and stress/strain-free condition owing to the selective depositional process used to grow the seed layer 402.

Figure 9:
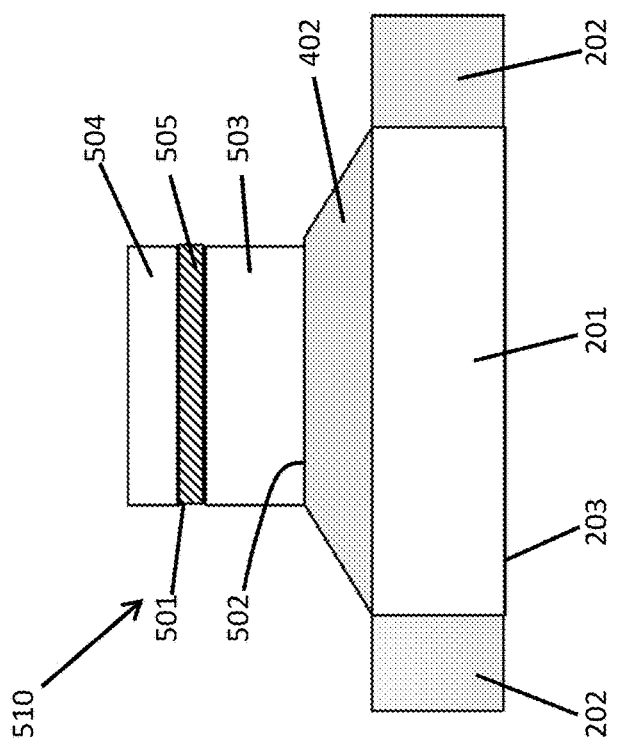
FIG. 9 is a side schematic view of a fourth fabrication stage of a magnetic tunnel junction (MTJ) stack of an MRAM cell in accordance with the further or alternative embodiments of FIG. 8.
Figure 8:
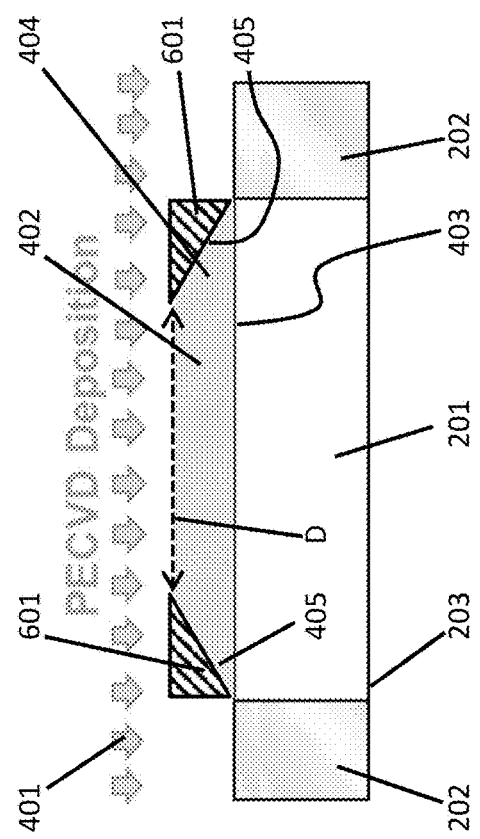
FIG. 8 is a side schematic view of a third fabrication stage of a magnetic tunnel junction (MTJ) stack of an MRAM cell in accordance with further or alternative embodiments.

With reference to FIGS. 8 and 9 and in accordance with further or alternative embodiments, the selective deposition of the seed layer material 401 can be masked by placement of a mask 601 over peripheral or other portions of the metallic landing pads 201. The mask 601 can be formed of materials that are similar to those of the dielectric pads 202 and can be but do not need to be disposed over the dielectric pads 202 as well. In any case, the presence of the mask 601 can provide for sidewalls 405 of the seed layer 402 that are angled with respect to the plane of the upper surface 403 as shown in FIG. 8. The interior distance D between opposite sides of the mask 601 can be provided such that the upper surface 502 of the seed layer 402 is at least as wide as the MTJ 501 as shown in FIG. 9.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a magneto-resistive random access memory (MRAM) cell with at least one magnetic tunnel junction (MTJ), the method comprising:
   disposing a metallic landing pad consisting of at least one of copper (Cu) and aluminum (Al) within a dielectric pad in a substrate; and
   selectively depositing seed layer material over the substrate to form a seed layer on which the MTJ is disposable on the metallic landing pad but not the dielectric pad,
   wherein:
   uppermost and lowermost surfaces of the metallic landing pad are coplanar with uppermost and lowermost surfaces of the dielectric pad, respectively,
   the metallic landing pad has a uniform width from the uppermost surface of the dielectric pad to the lowermost surface of the dielectric pad, and
   selective deposition of the seed layer material is executed such that:
   the seed layer has a substantially similar width as the uniform width of the metallic landing pad, and
   sidewalls of the seed layer and entire sidewalls of the metallic landing pad are substantially coplanar.

2. The method according to claim 1, wherein the disposing comprises damascene metal line formation.

3. The method according to claim 1, further comprising conducting a pre-cursor treatment of the substrate prior to the selective deposition.

4. The method according to claim 1, wherein the selective deposition comprises at least one of plasma-enhanced chemical vapor deposition (PECVD) and electro-less plating of metallic material.

5. The method according to claim 1, further comprising depositing and patterning the MTJ on the seed layer.

6. The method according to claim 1, wherein the seed layer is substantially absent copper (Cu).

7. The method according to claim 1, wherein the method is completed absent lithographic, etch and polishing operations.

8. The method according to claim 1, wherein no seed layer material is deposited onto an upper surface of the dielectric pad.

9. A method of fabricating a magneto-resistive random access memory (MRAM) cell with at least one magnetic tunnel junction (MTJ), the method comprising:
   disposing a metallic landing pad consisting of at least one of copper (Cu) and aluminum (Al) within a dielectric pad in a substrate;
   selectively depositing seed layer material over the substrate to form a seed layer on which the MTJ is disposable on the metallic landing pad but not the dielectric pad; and
   depositing and patterning the MTJ on an upper surface of the seed layer to form at least a portion of the MRAM cell,
   wherein:
   uppermost and lowermost surfaces of the metallic landing pad are coplanar with uppermost and lowermost surfaces of the dielectric pad, respectively,
   the metallic landing pad has a uniform width from the uppermost surface of the dielectric pad to the lowermost surface of the dielectric pad, and
   selective deposition of the seed layer material is executed such that:
   the seed layer has a substantially similar width as the uniform width of the metallic landing pad, and
   sidewalls of the seed layer and entire sidewalls of the metallic landing pad are substantially coplanar.

10. The method according to claim 9, wherein no seed layer material is deposited onto an upper surface of the dielectric pad.

11. The method according to claim 9, wherein, following the depositing and patterning, the MTJ comprises:
   a reference layer disposed on the upper surface of the seed layer without copper;
   a free layer remote from the reference layer; and
   an insulator interposed between the reference and free layers.

* * * * *